US006683363B2

(12) United States Patent
Challa

(10) Patent No.: US 6,683,363 B2
(45) Date of Patent: Jan. 27, 2004

(54) TRENCH STRUCTURE FOR SEMICONDUCTOR DEVICES

(75) Inventor: Ashok Challa, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/898,133

(22) Filed: Jul. 3, 2001

(65) Prior Publication Data

US 2003/0006452 A1 Jan. 9, 2003

(51) Int. Cl.$^7$ .................. H01L 23/62; H01L 23/58; H01L 29/94; H01L 29/76
(52) U.S. Cl. .................. 257/496; 257/487; 257/491; 257/328; 257/355
(58) Field of Search .................. 257/328–332, 257/343, 355, 487, 491, 496, 499–509

(56) References Cited

U.S. PATENT DOCUMENTS

| 4,796,070 A | * | 1/1989 | Black .................. 357/23.4 |
| 4,974,059 A | * | 11/1990 | Kinzer .................. 357/23.4 |
| 5,233,215 A | | 8/1993 | Baliga |
| 5,262,336 A | | 11/1993 | Pike, Jr. et al. |
| 5,365,102 A | * | 11/1994 | Mehrotra et al. .......... 257/471 |
| 5,430,324 A | | 7/1995 | Bencuya |
| 5,578,851 A | | 11/1996 | Hshieh et al. |
| 5,597,765 A | | 1/1997 | Yilmaz et al. |
| 5,605,852 A | | 2/1997 | Bencuya |
| 5,639,676 A | | 6/1997 | Hshieh et al. |
| 5,877,528 A | | 3/1999 | So |
| 5,949,124 A | | 9/1999 | Hadizad et al. |
| 6,104,054 A | * | 8/2000 | Corsi et al. .................. 257/306 |

OTHER PUBLICATIONS

S.C. Jain, Physics of Semiconductor Devices, Proceedings of the Third Int'l Workshop, Madras (India), Committee on Science and Technology in Developing Countries, Nov. 27–Dec. 2, 1985.
B. G. Wilamowski, Schottky Diodes with High Breakdown Voltages, Solid–State Electronics, 1983, vol. 26, No. 5, pp. 491–493, Pergamon Press, Ltd.

* cited by examiner

Primary Examiner—Nathan J. Flynn
Assistant Examiner—Johannes P Mondt
(74) Attorney, Agent, or Firm—Townsend and Townsend and Crew, LLP

(57) ABSTRACT

A MOS trench structure integrated with a semiconductor device for enhancing the breakdown characteristics of the semiconductor device, comprises a semiconductor substrate, a plurality of parallel trenches formed in the semiconductor substrate, a peripheral trench formed in the semiconductor substrate and spaced from and at least partially surrounding the parallel trenches, a dielectric material lining the trenches, and a conductive material substantially filling the dielectric-lined trenches.

12 Claims, 8 Drawing Sheets

TRENCH STRUCTURE FOR SEMICONDUCTOR DEVICES

BACKGROUND OF THE INVENTION

The present invention relates in general to semiconductor devices. More specifically, the present invention relates to trench structures, which can be used to enhance the performance of semiconductor devices.

There exist a variety of semiconductor devices commonly used in power applications. One such device is the Schottky barrier. A Schottky barrier comprises a metal-semiconductor interface, which functions as rectifier for controlling current transport.

A figure of merit, which is used to measure the blocking capability of a Schottky barrier rectifier is its breakdown voltage. A breakdown voltage in this context refers to the maximum reverse voltage, which can be supported across the device, while still being able to provide a blocking function. Breakdown in a Schottky barrier rectifier is normally an "avalanche" type breakdown, which is predominantly attributable to a phenomenon known as "impact ionization".

FIG. 1 shows a cross section of a basic Schottky barrier rectifier 10. A first metal layer 100 is formed on a semiconductor layer 102. Typically, the semiconductor layer 102 is comprised of an epitaxial layer 104, which lends itself as a drift region, and a more heavily doped substrate 106. Heavily doped substrate 106 and a second metal layer 108 provide an ohmic contact for the device.

Applying a reverse bias voltage VREV across the Schottky barrier rectifier 10 creates a depletion region 110, across which a majority of the applied voltage is dropped. As the reverse voltage is increased, electric fields in the depletion region 110 become greater. These increasing electric fields cause the charge carriers to accelerate and, if sufficiently accelerated, can cause the creation of electron-hole pairs by collision with dopant atoms. The more carriers that are generated, the more carriers having sufficient energy to cause impact ionization there become. Hence, impact ionization is a snowball effect, whereby a cascade of electron-hole pairs are created by a succession and multiplication of collisions. A point is eventually reached where the rate of impact ionization is so great that the device cannot support any further reverse bias applied across it. This voltage limit is commonly referred to in the art as the "avalanche breakdown voltage".

The basic Schottky barrier rectifier 10 shown in FIG. 1 is limited by its reverse blocking capability, since electric fields tend to converge at the edges of the metal layer 100. Because of this, techniques for terminating the Schottky barrier rectifier have been sought. Two commonly used techniques, which reduce the edge effects are a local oxidation of silicon (LOCOS) structure and the diffused field ring structure described in "Modern Power Devices" by B. J. Baglia, 1987, Reprinted Edition, pp. 437–438. These two approaches are shown here in FIGS. 2 and 3. Each of these prior art techniques has the effect of reducing electric field crowding at the metal edges and, consequently, a higher breakdown voltage is achieved.

A technique proposed to achieve even better reverse blocking capabilities in a Schottky barrier rectifier is described in Wilamowski, B. M., "Schottky Diodes with High Breakdown Voltages," *Solid State Electron.*, 26, 491–493 (1983). A cross section of the structure proposed in this article, referred to as a Junction Barrier Controlled Schottky Rectifier (i.e. "JBS rectifier"), is shown here in FIG. 4. A series of p-type regions 400 are formed in and at the surface of the drift region 402 of the device. These p-type regions 400 act as screens to lower the electric field near the surface. Since electric fields at the surface are what determine the breakdown voltage of the device, introduction of the p-regions 400 results in a higher breakdown voltage.

An undesirable characteristic of the JBS rectifier relates to the p-n junctions, which are formed between the p regions 400 and the drift region 402. For silicon devices having a high reverse breakdown voltage, a forward bias exceeding 0.7 volts is required before a reasonable forward conduction current of the Schottky barrier can be realized. Unfortunately, voltages higher than 0.7 volts have the effect of turning on the p-n junctions. When on, minority carriers are introduced, which slow the switching speed of the device. A reduction in switching speed is undesirable, particularly if the Schottky barrier rectifier is to be used in switching applications such as, for example, switch-mode power supplies.

To overcome the forward bias limitations associated with the JBS rectifier, an alternative device structure has been proposed, which utilizes a series of parallel metal oxide semiconductor (MOS) trenches in replace of the p-type regions. This MOS Barrier Schottky Rectifier (i.e. "MBS rectifier") is proposed in B. J. Baliga, "New Concepts in Power Rectifiers," *Proceedings of the Third International Workshop on the Physics of Semiconductor Devices*, November 24–28, World Scientific Publ. Singapore, 1985. A cross-section of an MBS rectifier 50 is shown in FIG. 5A. It comprises a first metal layer 508, over which a semiconductor layer 502 is formed. Typically, the semiconductor layer 502 is comprised of an epitaxial layer 504, which lends itself as a drift region, and a more heavily doped substrate 506. Heavily doped substrate 506 and first metal layer 508 provide an ohmic contact for the device. MBS rectifier 50 also includes a number of parallel trenches 512 formed in epitaxial layer 504, each of which has an end that terminates (or "merges") with a termination trench 514, which includes a segment that runs essentially perpendicular to the parallel trenches 512. Termination trench 514 and parallel trenches 512 are lined with a dielectric 516, e.g. silicon dioxide, and are filled with a conductive material 518, e.g. metal (as shown in FIG. 5A) or doped polysilicon. A second metal layer 520 is formed over the entire surface of the structure. Note that in FIG. 5A, metal layer 520 is shown as only partially covering the surface. However, this is done so that underlying elements of the rectifier 50, which would otherwise be covered by metal layer 520, can be seen. The metal/semiconductor barrier of MBS rectifier 50 is formed at the junction between second metal layer 520 and upper surfaces of mesas 522 formed between parallel trenches 512.

In many respects, the MBS rectifier is superior to the JBS rectifier. However, it too has limits on its reverse blocking capabilities. These limits can be illustrated by reference to FIG. 5B, which shows a top or "layout" view of the MBS rectifier in FIG. 5A. The arrows, at the ends of mesas 522, which point at labels "E" ("E" electric field), are present to show how under reverse bias conditions, electric fields tend to crowd toward the ends of mesas 522. This electric field crowding phenomenon is due to faster depletion in these regions, compared to other regions in semiconductor layer 502. Accordingly, the breakdown voltage of the MBS rectifier shown in FIG. 5A is determined and, therefore, limited by the trench structure geometry illustrated in FIG. 5B.

SUMMARY OF THE INVENTION

Generally, a broken trench structure enhances the breakdown characteristics of semiconductor devices, according to various aspects of the present invention. For example, as explained in more detail below, a Schottky barrier rectifier, when integrated with the broken trench aspect of the present invention, shows enhanced reverse blocking capabilities, compared to that achievable in prior art structures.

According to a first aspect of the invention, a MOS trench structure integrated with a semiconductor device for enhancing the breakdown characteristics of the semiconductor device comprises a semiconductor substrate; a plurality of parallel trenches formed in the semiconductor substrate, each parallel trench defined by end walls, sidewalls and a bottom and each two adjacent parallel trenches separated by mesas containing the semiconductor device, said mesas having a mesa width; and a peripheral trench defined by ends, sidewalls and a bottom, said peripheral trench at least partially surrounding the parallel trenches, and said peripheral trench being spaced from the ends of the parallel trenches by a parallel trench to peripheral trench spacing; a dielectric material lining the ends, bottoms and sidewalls of the parallel and peripheral trenches; and a conductive material substantially filling the dielectric-lined trenches.

This aspect of the invention and others, together with a further understanding of the nature and the advantages of the inventions disclosed herein is described now in reference to the remaining portions of the specification and the attached drawings.

DETAILED DESCRIPTION OF THE INVENTION

Figure 6A:
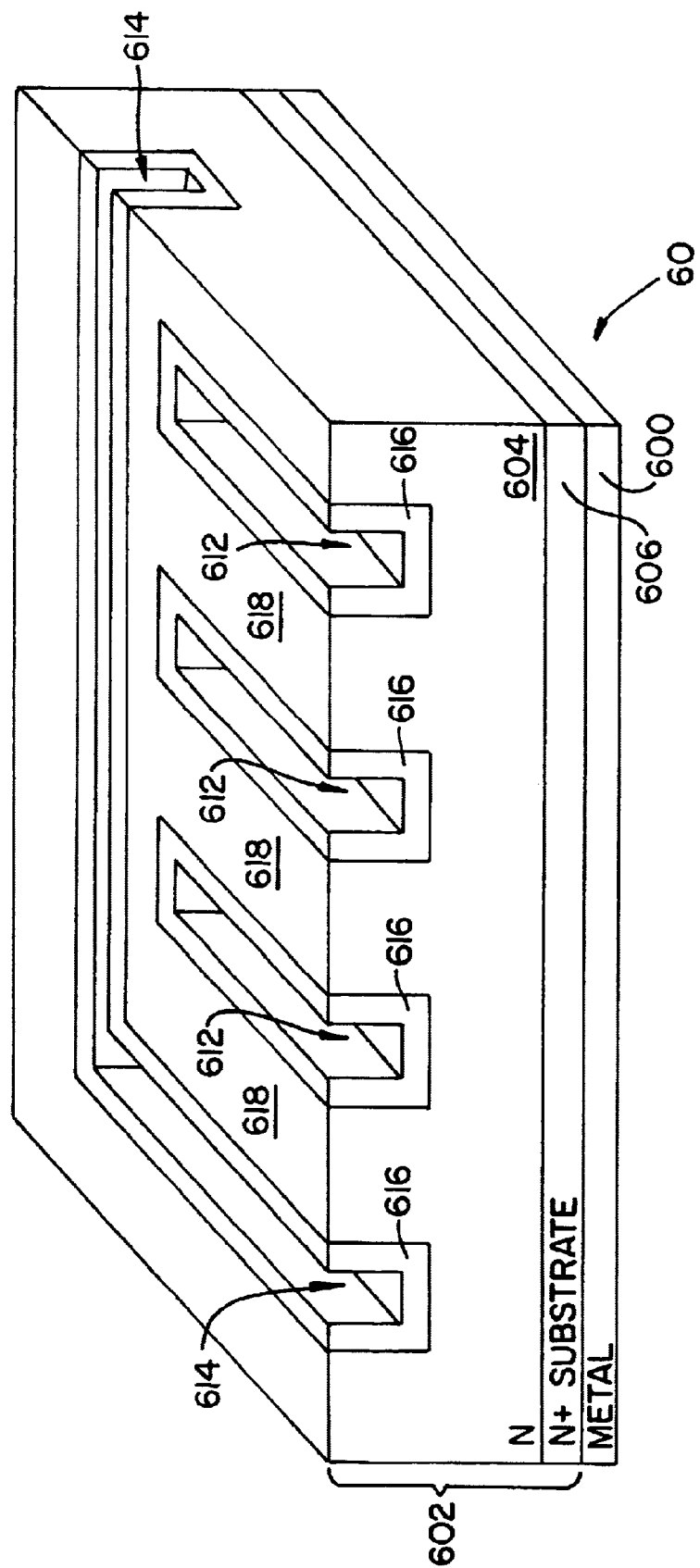
FIG. 6A is a cross-sectional, perspective view illustrating integration of the broken trench structure aspect of the present invention with a Schottky barrier rectifier, according to an embodiment of the present invention.

Referring first to FIG. 6A, there is shown a semiconductor device structure 60 comprising a Schottky barrier rectifier integrated with a MOS trench structure, according to an embodiment of the present invention. Device structure 60 comprises a first metal layer 600, over which a semiconductor layer 602 is formed. Semiconductor layer 602 may comprise a single layer of silicon or, as shown in FIG. 6A, may comprise an epitaxial layer 604 (or "drift" region) and a more heavily doped substrate 606. Heavily doped substrate 606 and first metal layer 600 provide an ohmic contact for the device. Device structure 60 also includes a MOS trench structure comprising a plurality of parallel trenches 612 and a peripheral trench 614 formed in epitaxial layer 604. Peripheral trench 614 has predetermined dimensions and spacings from parallel trenches 614, the preferred of which are provided below. Peripheral trench 614 and parallel trenches 612 are lined with a dielectric 616. These dielectric-lined trenches are filled with a conductive material (not shown in FIG. 6A) such as, for example, metal or doped polysilicon. Although not shown in FIG. 6A, a second metal layer is formed over the entire surface of the device structure. A metal/semiconductor barrier is formed at the junction between the second metal layer and upper surfaces of mesas 618, which are formed between parallel trenches 612.

Figure 1:
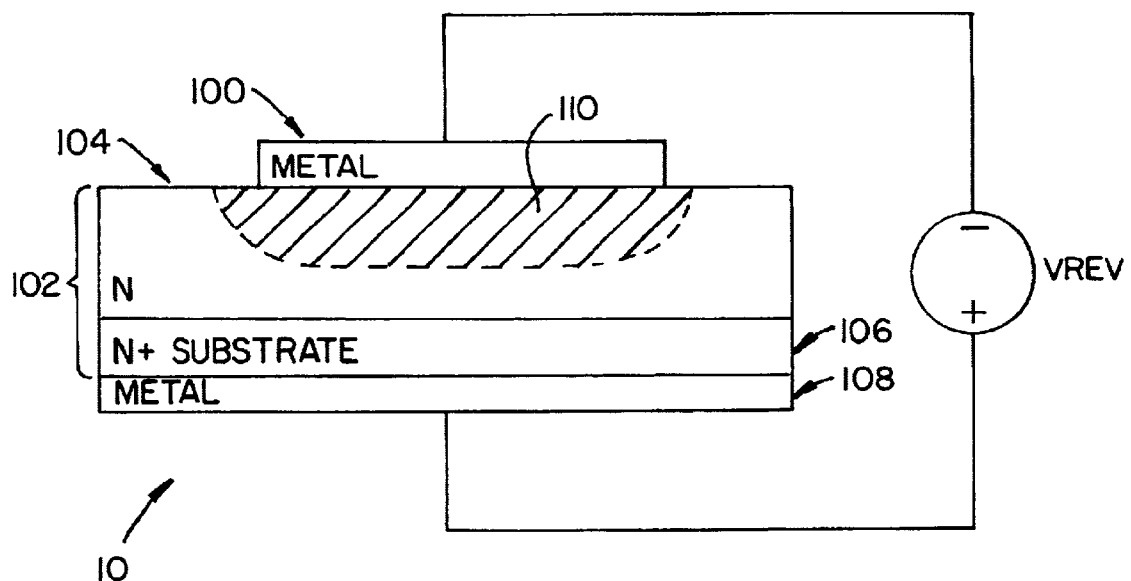
FIG. 1 is a cross-sectional view of a basic Schottky barrier rectifier.
Figure 2:
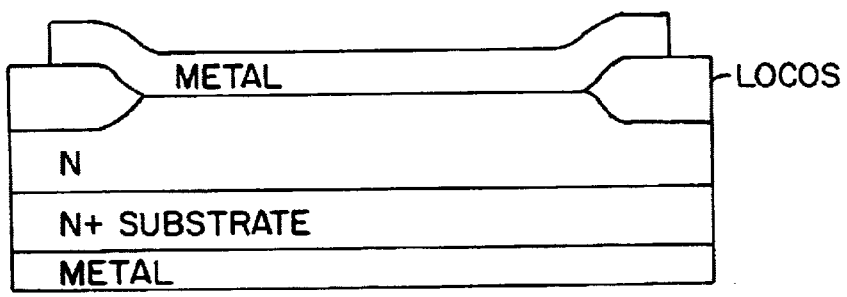
FIG. 2 is a cross-sectional view of a Schottky barrier rectifier having a local oxidation of silicon (LOCOS) structure for reducing edge effects.
Figure 3:
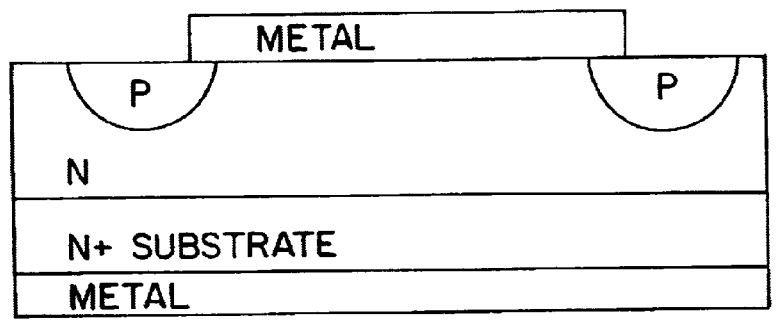
FIG. 3 is a cross-sectional view of a Schottky barrier rectifier having a diffused field ring structure for reducing edge effects.
Figure 4:
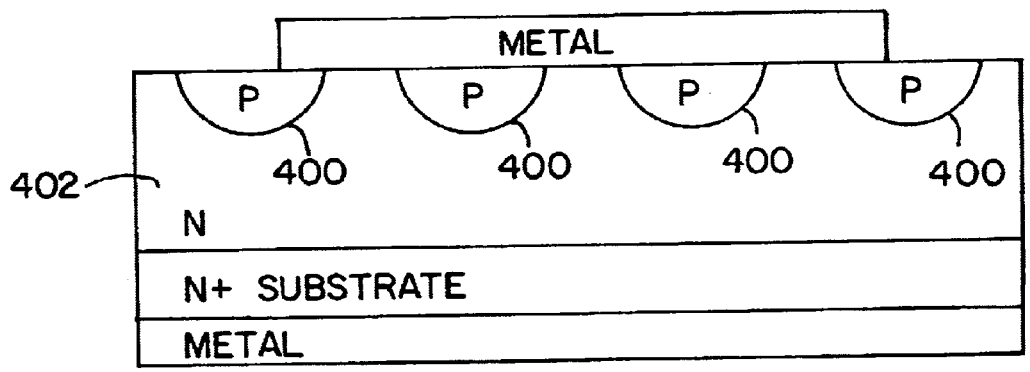
FIG. 4 is a cross-sectional view of a Schottky barrier rectifier having a plurality of diffusion regions, which function together as a screen to enhance the reverse blocking capabilities of the rectifier.
Figure 5A:
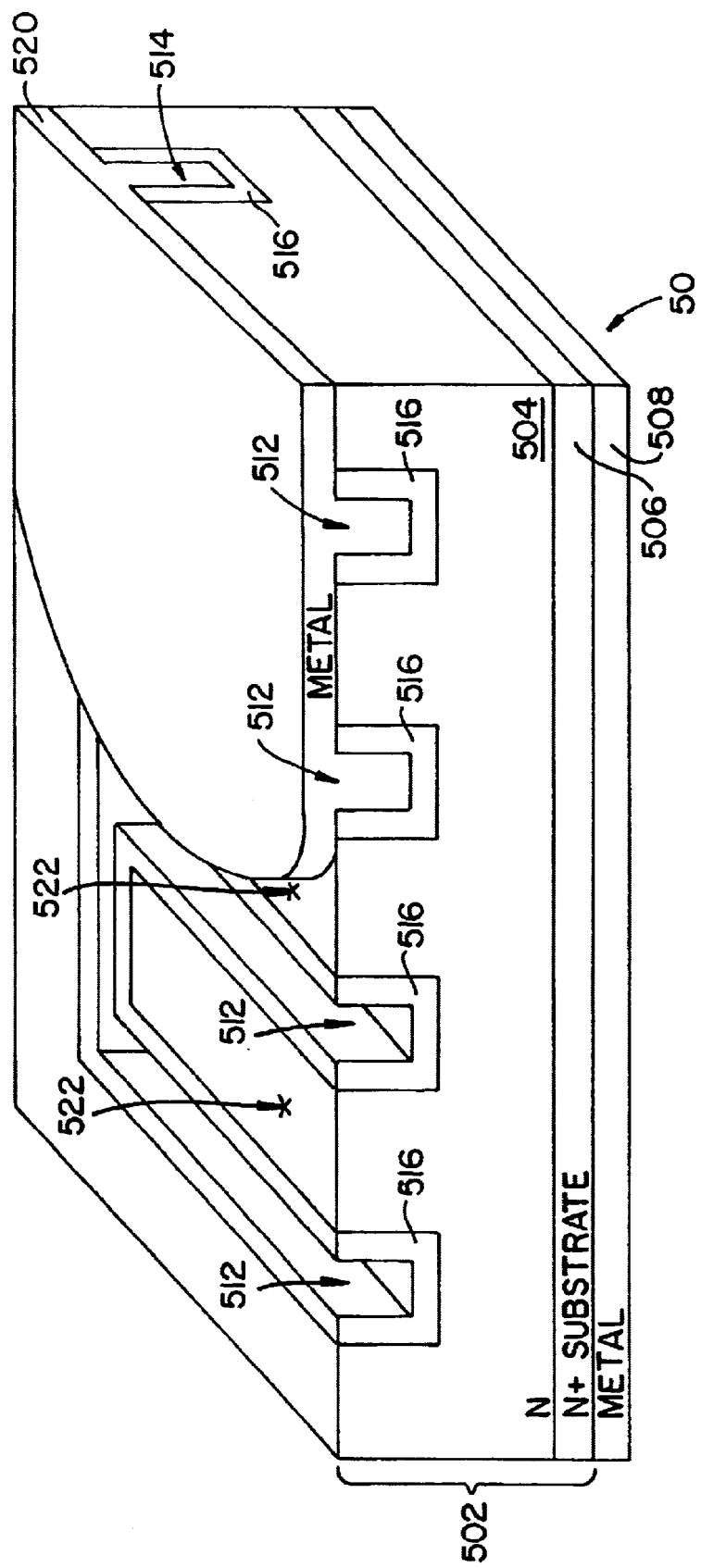
FIG. 5A is a cross-sectional, perspective view of a MOS Barrier Schottky Rectifier.
Figure 5B:
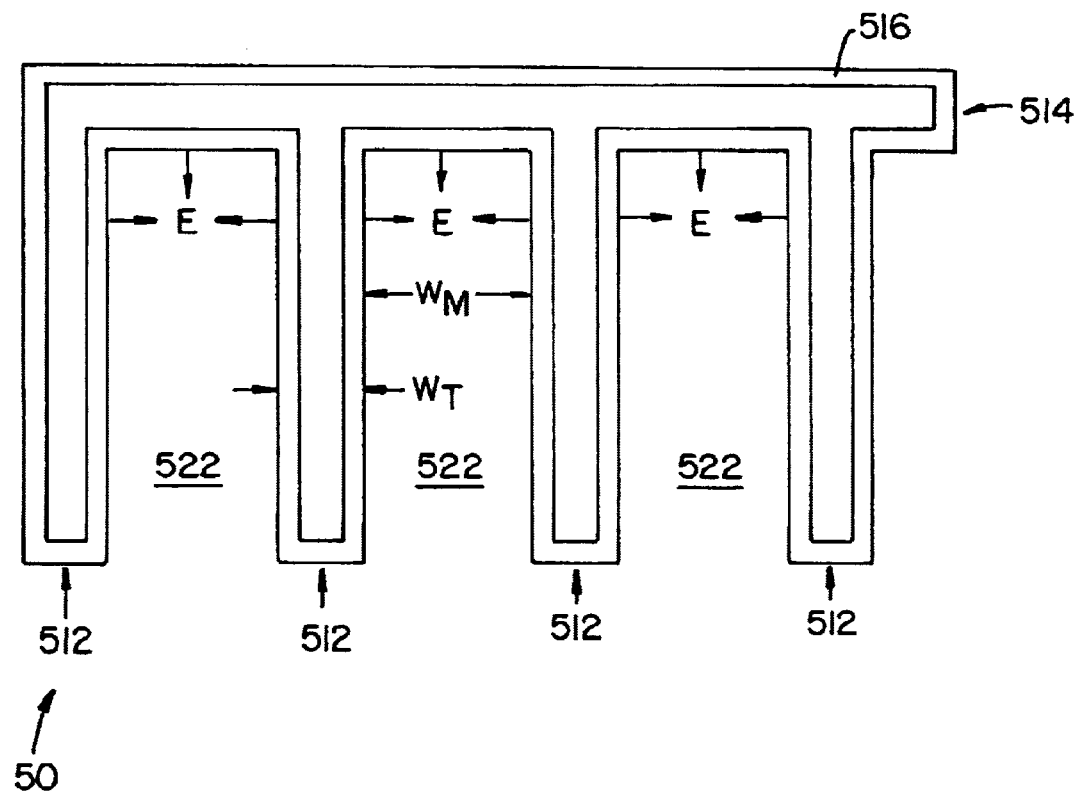
FIG. 5B is a layout view of the MOS Barrier Schottky Rectifier shown in FIG. 5A.
Figure 6B:
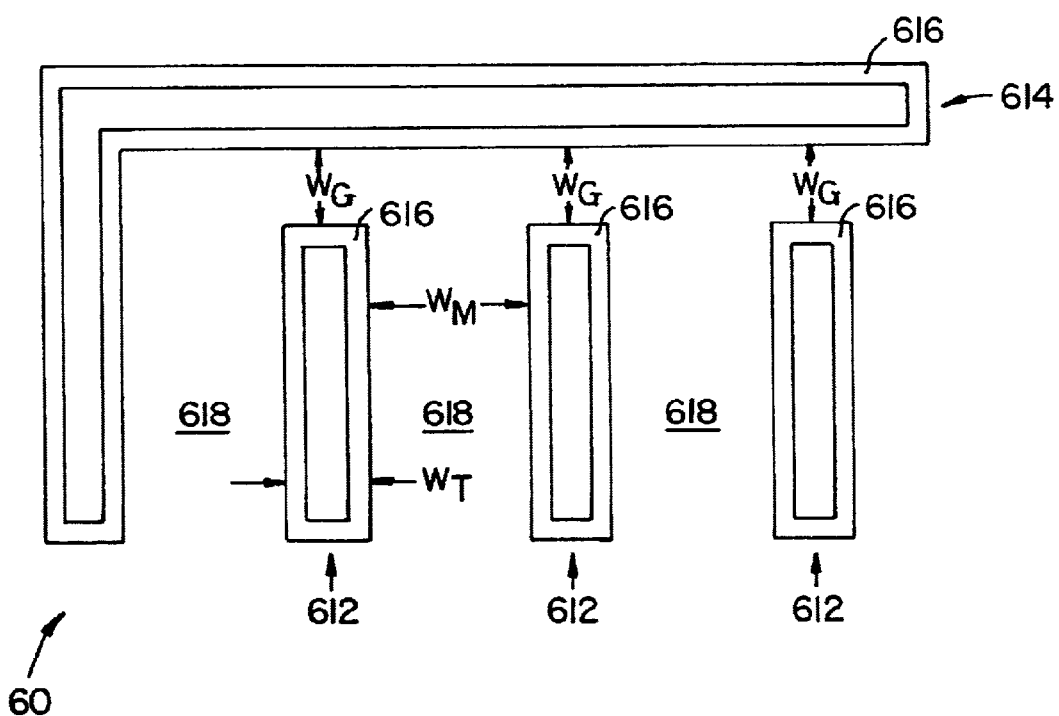
FIG. 6B is a layout view of the device shown in FIG. 6A.

A top or "layout" view of the Schottky barrier rectifier in FIG. 6A is shown in FIG. 6B. As shown, parallel trenches 612 have widths $W_T$, are separated by mesa widths $W_M$, and are spaced away from peripheral trench 614 by gaps having a dimension $W_G$. These gaps function to reduce the electrical field crowding effect observed in the prior art MBS rectifier shown in FIGS. 5A and 5B. In a preferred embodiment, $W_G$ is approximately equal to $W_M/2$.

Figure 7:
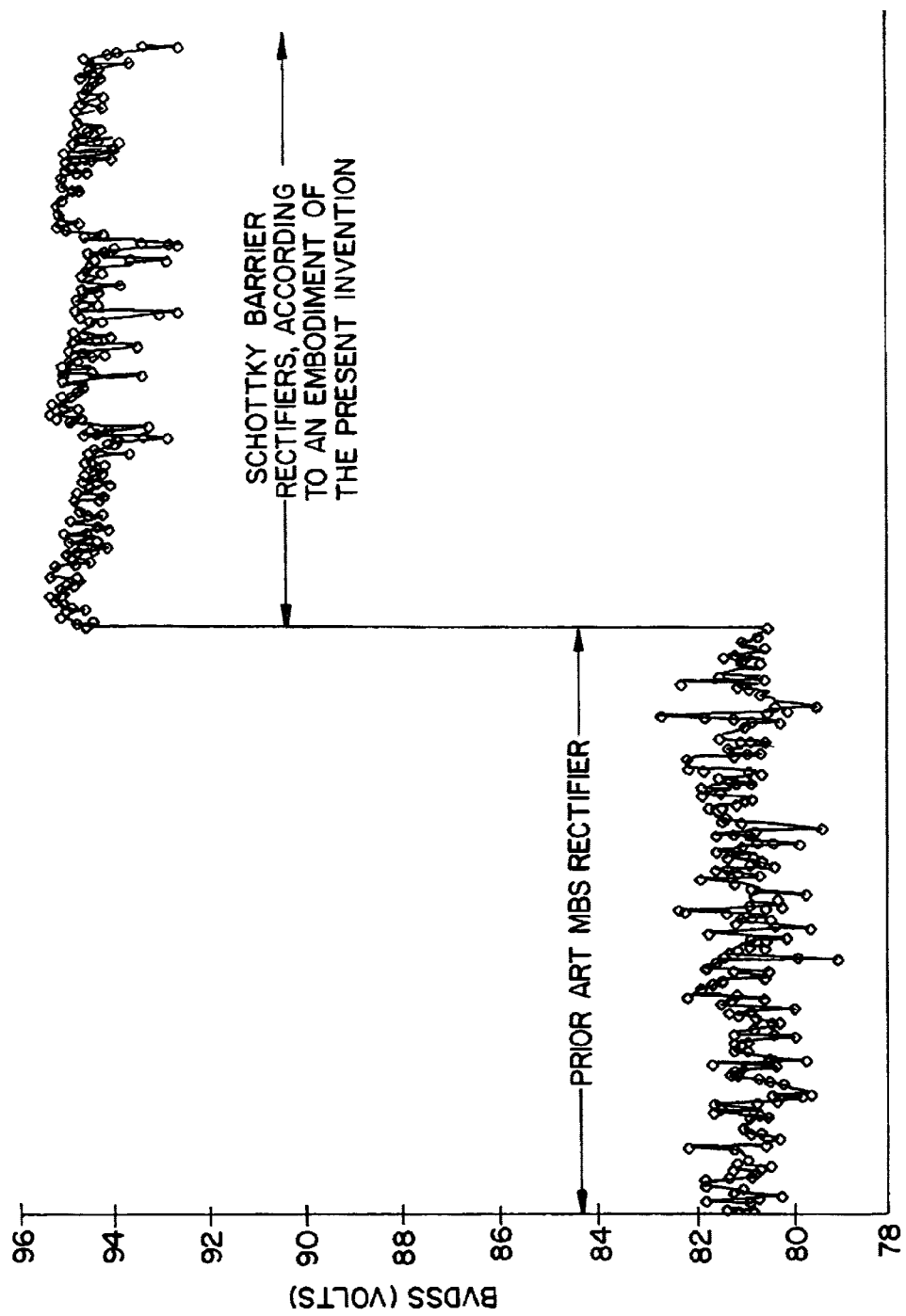
FIG. 7 is a plot showing and comparing measured breakdown voltages of a number of Schottky barrier rectifiers having trench structures similar to that shown in FIGS. 6A and 6B to a number of Schottky barrier rectifiers having trench structures similar to that shown in FIGS. 5A and 5B.

Using the "broken trench" structure shown in FIGS. 6A and 6B results in a substantially higher breakdown voltage than that which is obtainable using the prior art trench structure shown in FIG. 5B. FIG. 7 compares the measured breakdown voltages of a number of Schottky barrier rectifiers having a trench structure similar to that shown in FIGS. 6A and 6B to a number of Schottky barrier rectifiers having a trench structure similar to that shown in FIGS. 5A and 5B. For these exemplary samples, it is seen that the breakdown voltage is over 10 volts higher than the breakdown voltages of samples having the prior art trench structure.

The "broken trench" aspect of the present invention is not limited to use in Schottky barrier rectifier type devices. Indeed, the inventor of the present invention has contemplated that such a "broken trench" structure may be integrated with any other semiconductor device that would benefit from its presence. The basic concept is that comprising a series of parallel trenches and a perpendicular trench formed in a semiconductor layer. An example of an application of this aspect of the invention is shown in FIG. 8.

Figure 8:
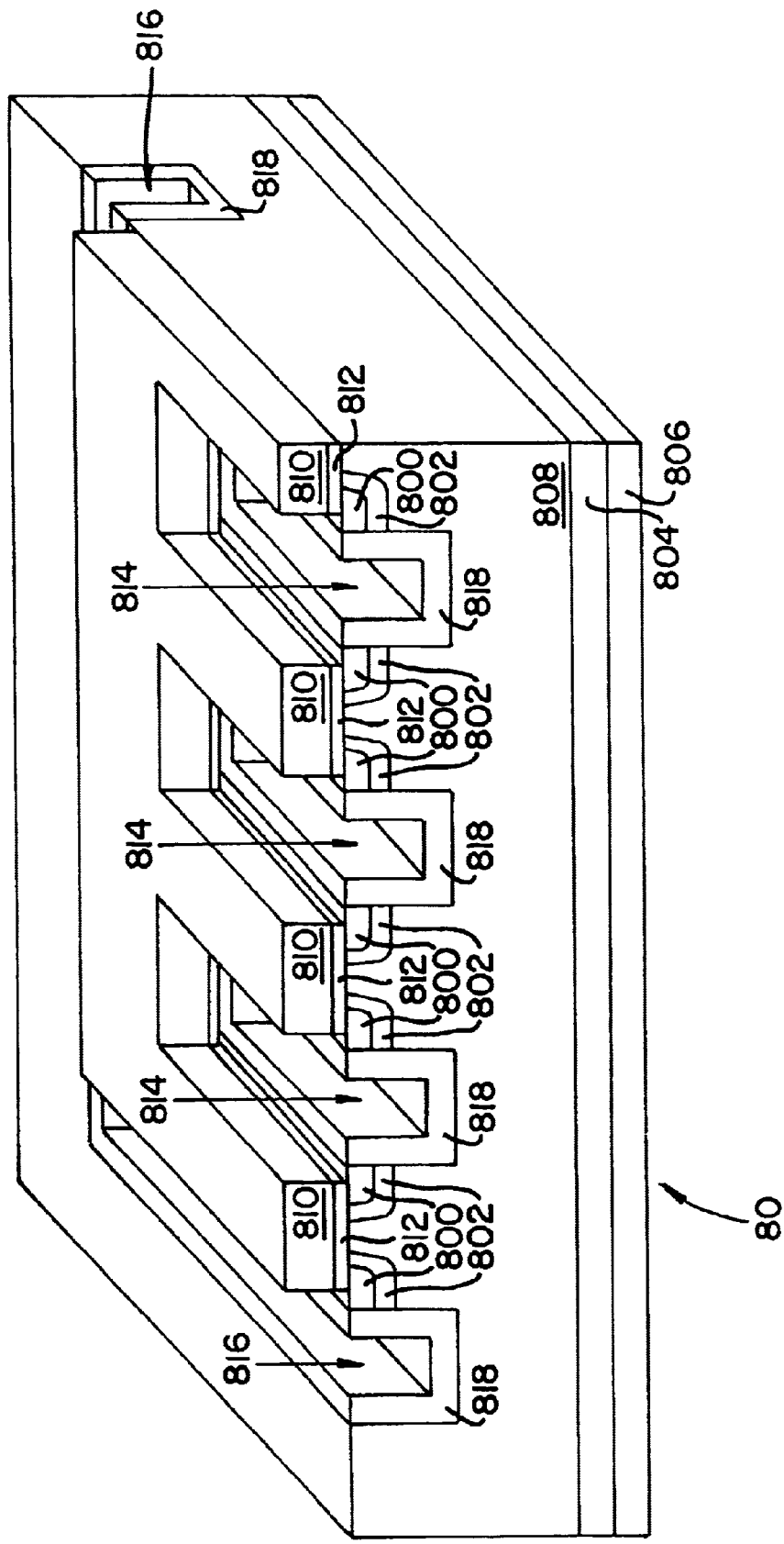
FIG. 8 is a cross-sectional, perspective view illustrating integration of the broken trench structure aspect of the present invention with a double-diffused radio frequency field effect transistor.

FIG. 8 illustrates integration of such a trench structure with a double-diffused radio frequency field effect transistor (i.e. RF FET), according to another embodiment of the present invention. RF FET is a vertical device and comprises source regions 800 having a first conductivity type (e.g. n-type) formed in wells 802 having a second conductivity type (e.g. p-type); a drain 804 of the first conductivity type having a drain contact 806; an epitaxial layer 808 of the first conductivity type formed between wells 802 and drain 804; and a gate 810 overlying a gate oxide 812. Although not shown in FIG. 8, source regions 800 are interconnected to form a single source. Operation of the RF FET itself is known in the art and, therefore, will not be discussed here.

Integrated with the RF FET are a series of parallel trenches 814 and a peripheral trench 816, which form a MOS trench RE FET 80, in accordance with another embodiment of the present invention. Peripheral and parallel trenches 816 and 814 are lined with a dielectric 818. These dielectric-lined trenches are filled with a conductive material (not shown in FIG. 8) such as, for example, metal or doped polysilicon. Also, although not shown in FIG. 8, a conductive material is formed over the entire upper surface of the RE FET structure 80.

While the above is a complete description of the preferred embodiments of the invention, various alternatives, modifications, and equivalents may be used. For example, the basic "broken trench" aspect of the present invention may be integrated with other types of semiconductor devices to enhance their breakdown characteristics. Accordingly, in no way should the broken trench aspect of the present invention, be viewed as only applying to the Schottky barrier rectifier and RF FET device examples provided herein. For this and other reasons, therefore, the above description should not be taken as limiting the scope of the invention, which is defined by the appended claims.

What is claimed is:

1. A MOS trench structure integrated with a semiconductor device for enhancing the breakdown characteristics of the semiconductor device, said MOS trench structure comprising:
   a semiconductor substrate;
   a plurality of non-contiguous parallel trenches formed in the semiconductor substrate, each parallel trench defined by ends, sidewalls and a bottom, and each two adjacent parallel trenches separated by a mesa containing the semiconductor device, said mesas having a mesa width;
   a peripheral trench formed in the semiconductor substrate and defined by sidewalls and a bottom, said peripheral trench at least partially surrounding the parallel trenches and having a portion that is spaced from ends of the parallel trenches by a parallel trench to peripheral trench spacing;
   a dielectric material lining the parallel and peripheral trenches; and
   a conductive material substantially filling the dielectric-lined trenches.

2. The MOS trench structure according to claim 1, wherein the parallel trench to peripheral trench spacing is approximately equal to one half the mesa width.

3. The MOS trench structure according to claim 1, wherein the semiconductor substrate comprises:
   a semiconductor contact layer, and
   an epitaxially-grown semiconductor layer formed on a first major surface of the semiconductor contact layer, said epitaxially-grown semiconductor layer having a doping concentration that is lower than a doping concentration of the semiconductor contact layer.

4. The MOS trench structure according to claim 3, further comprising:
   a first metal contact layer formed on an opposing second major surface of the semiconductor contact layer.

5. The MOS trench structure according to claim 4, wherein the semiconductor device further comprises a second metal layer formed over the mesas and the dielectric-lined, conductive-material-filled parallel and peripheral trenches.

6. A MOS trench structure integrated with a semiconductor device for enhancing the breakdown characteristics of the semiconductor device, said MOS trench structure comprising:
   a semiconductor contact layer;
   an epitaxially-grown semiconductor layer formed on a first major surface of the semiconductor contact layer;
   a plurality of non-contiguous parallel trenches formed in the epitaxially-grown semiconductor layer, each parallel trench defined by ends, sidewalls and a bottom, and each two adjacent parallel trenches separated by a mesa having a mesa width, said semiconductor device having a gate between each two adjacent parallel trenches, the gates being configured so that a current flows vertically in the semiconductor device when the gates are biased to turn on the semiconductor device; and
   a peripheral trench formed in the epitaxially-grown semiconductor layer and defined by sidewalls and a bottom, said peripheral trench at least partially surrounding the parallel trenches and having a portion that is spaced from ends of the parallel trenches by a parallel trench to peripheral trench spacing;
   a dielectric material lining the parallel and peripheral trenches; and
   a conductive material substantially filling the dielectric-lined trenches.

7. The structure according to claim 5, wherein the semiconductor device is a Schottky barrier rectifier and the first and second metal contact layers comprise the cathode and anode contacts for the Schottky barrier rectifier.

8. The structure according to claim 6, wherein the parallel trench to peripheral trench spacing is approximately equal to one half the mesa width.

9. A MOS trench structure integrated with a radio frequency field effect transistor (RF FET) for enhancing the breakdown characteristics of the RF FET, said MOS trench structure comprising:
   a drain contact layer having a first conductivity type;
   an epitaxially-grown semiconductor layer formed on a first major surface of the drain contact layer, said epitaxially-grown semiconductor layer having the same conductivity type as the drain contact layer but with a lower doping concentration;
   a first metal contact layer formed on an opposing and second major surface of the drain contact layer;
   a plurality of non-contiguous parallel trenches formed in the epitaxially-grown semiconductor layer, each parallel trench defined by ends, sidewalls and a bottom, and adjacent parallel trenches being separated by mesas, which contain the RF FET, the RF FET having gate regions and source regions configured so that a current flows vertically between the source regions and the drain contact layer when the gate regions are biased to turn an the RF FET;
   a peripheral trench formed in the epitaxially-grown semiconductor layer and defined by sidewalls and a bottom, said peripheral trench at least partially surrounding the parallel trenches and having a portion that is spaced from ends of the parallel trenches by a parallel trench to peripheral trench spacing;
   a dielectric material lining the parallel and peripheral trenches; and
   a conductive material substantially filling the dielectric-lined trenches.

10. The structure according to claim 9, wherein the RF FET comprises:
    well regions of a second conductivity type formed in upper corners of the mesas, each two well regions in a mesa separated by a gap, wherein the source regions are of the first conductivity type and are formed in the well regions, and the gate regions are formed over portions of the source regions and a portion of the gap with in each mesa.

11. The structure according to claim 9, wherein the parallel trench to peripheral trench spacing is approximately equal to one half a width of the mesas.

12. The structure according to claim 1 wherein the semiconductor device is a rectifier formed in the mesas between adjacent parallel trenches, the rectifier being configured to conduct current vertically in the mesas when biased in the on state.

* * * * *